United States Patent [19]
Tchamov et al.

[11] Patent Number: 5,825,256
[45] Date of Patent: Oct. 20, 1998

[54] EMITTER COUPLED MULTIVIBRATOR CIRCUIT

[76] Inventors: Nikolay Tchamov, Lindforsinkatu 21 A 17, FIN-33720 Tampere; Petri Jarske, Pirilänkuja 8, FIN-34240 Kämmenniemi, both of Finland

[21] Appl. No.: 853,934

[22] Filed: May 9, 1997

[30] Foreign Application Priority Data

May 8, 1996 [FI] Finland ..................................... 96184

[51] Int. Cl.[6] .................................................. H03K 3/282
[52] U.S. Cl. .................. 331/113 R; 331/144; 331/177 R
[58] Field of Search ............................... 331/113 R, 144, 331/177 R

[56] References Cited

U.S. PATENT DOCUMENTS 3,582,809  6/1971  Rigby .................................... 331/113 R
3,855,551  12/1974  Ishigaki et al. ...................... 331/113 R

FOREIGN PATENT DOCUMENTS 1 354 948  5/1974  United Kingdom .
1 358 138  6/1974  United Kingdom .

*Primary Examiner*—Siegfried H. Grimm
*Attorney, Agent, or Firm*—Scully, Scott, Murphy & Presser

[57] ABSTRACT

An emitter-coupled multivibrator circuit including a pair of main transistors (Q1,Q2) having a positive feedback, in which the base of each transistor is connected to the collector of the other transistor. A capacitor (C) is connected between the emitters of the main transistors. The circuit further comprises pull-down transistors (Q3,Q4), cross-connected so that they are positively driven to alternate between a conducting and a non-conducting state according to the states of the main transistors. The frequency of the oscillator is adjusted by controlling the current (Icon) passing through the capacitor (C). Additionally, a compensating current (I2) is arranged to flow through the collector resistors (Rc1,Rc2) of the main transistors so that the total current passing through each resistor is essentially constant and independent of the control current (Icon). This way the signal amplitude of the oscillator is not affected by the frequency control.

5 Claims, 2 Drawing Sheets

EMITTER COUPLED MULTIVIBRATOR CIRCUIT

FIELD OF INVENTION

The invention relates generally to oscillator circuits, and specifically to multivibrator-based oscillators.

BACKGROUND OF THE INVENTION

Current and voltage controlled oscillators (ICO and VCO) are important components in the structures of transmitters and receivers. When applications in portable wireless communications systems are concerned, the main requirements for VCO/ICO:s are: an operational frequency range of 1 to 20 GHz, very low phase noise, and the lowest possible operating voltage and power consumption. Depending on the structure, a communications device may comprise several VCO/ICO:s needed for different purposes, e.g. frequency conversion, synthesis, modulation etc. Their performance will significantly affect the performance of the entire communications unit. However, the demand to implement these oscillators for silicon technologies faces several problems.

During the last few years several research projects have focused on finding optimal solutions. Two main types of oscillators are used as the cores of VCO/ICO:s: sinusoidal oscillators and relaxational oscillators. Sinusoidal oscillators usually produce the best parameters as far as high frequency and low phase noise are concerned, but they can be easily implemented mostly on GaAS technologies only. The transition to Bipolar, CMOS, or BiCMOS technologies causes several problems mainly due to the highly conductive wafer substrate. However, the speed of such available technologies is a challenge to researchers, as at present transient frequencies of 10 to 40 GHz are reached, a transient range that was previously considered to be able to be covered by materials based on GaAS only. The speed of silicon-based technologies is at present sufficient for mobile communication in the frequency range of 1 to 20 GHz, used by most mobile stations and wireless LANs. An additional driving factor in the design of portable equipment has always been a high demand for as low an operating voltage supply as possible and very low power consumption.

In LC type of oscillators the active circuit components are kept out of the non-linear operation range, whereas in relaxational oscillators the sinusoidal signal is the result of the incapability of the pulse circuit to switch fast enough at very high frequencies.

Several different circuit structures can be used to implement oscillation circuits, that is oscillators. One of these is an astable (freely running) multivibrator. FIG. 1 shows a conventional emitter-coupled multivibrator circuit used for implementing voltage controlled oscillators (VCO). The circuit comprises a pair of transistors Q1 and Q2 between which there is provided a positive feedback by cross-connecting the base of each transistor to the collector of another transistor. The positive feedback, and series-resonant circuits Rc1-C and Rc2-C provided by the resistors Rc1 and Rc2 and the capacitance C make the multivibrator output oscillate continuously between two states once oscillation has been triggered. The values of the RC series-resonant circuit components determine the oscillation frequency.

The operation of a multivibrator will be studied in greater detail in the following. Let us assume that initially Q1 and Q3 are off (in a non-conducting state). When Q1 is off, the collector of Q1 and the base of Q2 are approximately at the supply voltage potential, and Q2 is on (in a conducting state) and the emitter current of Q2 is I1+I2. The buffer transistor Q4 is also on and supplies a base current to Q2. When Q2 is conductive, the current I1 passes from the emitter of Q2 via the capacitance C to the emitter of Q1. At this time the current I1 recharges/discharges the charge of the capacitance C, the emitter potential of Q1 falling at a certain rate until Q1 becomes conductive as the base emitter voltage of Q1 exceeds approx. 0.6 V. As Q1 becomes conductive, its collector voltage starts to drop and hence the buffer transistor Q3 starts to turn off. Due to the positive feedback provided via Q4, the base voltage of Q2 also drops and Q2 turns off. As Q2 turns off, the collector voltage of Q2 increases, speeding up the switching on of Q3. As Q3 switches on, the base current of Q1 increases via the positive feedback. The higher base current discharges faster the spurious capacitances of the base circuit of Q1 and thereby speeds up the switching on of Q1. When Q2 is off and Q1 is on, the current I2 passes from the emitter of Q1 via the capacitance C to the emitter of Q2, where the emitter voltage starts to drop until it again causes Q2 to turn on and, via Q3, Q1 to turn off.

The speed (maximum resonance frequency) of such a multivibrator circuit depends primarily on the properties of the transistors Q1 and Q2. A known way of increasing the speed of a multivibrator circuit is to implement the positive feedback from the collector of one transistor to the base of another transistor via a buffer transistor. This provides a higher base current which again discharges the spurious capacitances of the base circuits of the transistors Q1 and Q2 more rapidly and thus speeds up the switching of a transistor from one state to another.

The lowest possible supply voltage Vcc is at least 1.1 V when it is assumed that the current sources 3 and 4 are ideal, i.e. no voltage drop is generated in them. Replacing ideal current sources by a practical circuit structure, such as a current mirror provided by MOS transistors, increases Vcc. MOS current mirrors require an approx. 0.7 V direct-current voltage across them, the final Vcc thus being at least about 1.8 V. The volume resistance of MOS transistors is the main reason for the high drain-source voltage Vds when the transistors are on. Reverting to the operating principle of a circuit, it may be stated that either Q1-C-current mirror 4 or Q2-C-current mirror 3 constitute the current paths and that the current mirrors generate a stable current through the reference capacitor C, this being the main reason for the typically low phase noise. When looking for a new way to increase speed, the capacitance of the reference capacitor cannot be much more reduced as it would be about the same as that of the spurious capacitances, and thus controlled design of the circuit would no longer be possible.

However, nowadays higher and higher speeds are needed and at the same time the wish is to render the supply voltage as low as possible, especially in electronic devices using battery power supplies.

To realize a current or voltage controlled oscillator by means of a multivibrator circuit requires the addition of a suitable control solution to the circuit. Such a control should be as simple as possible.

In the circuit of FIG. 1 the pulse amplitude is determined by the sum of the currents I1+I2 multiplied by the value of the collector resistor Rc1 or Rc2 of the corresponding cycle. Pulse width is determined by the value of the current fed by either I1 or I2 via the reference capacitor C during its recharge cycles. Hence the capacitance of the reference capacitor C or the current passing through it have to be changed for frequency control.

The capacitance can be changed if a varactor is used as the reference capacitor C. The problem is, however, that varactor technologies are usually not compatible with e.g. BiCMOS technologies. Instead, a PN junction can be used in the BiCMOS technology. In this case, however, in the circuit of FIG. 1 the capacitor is operating continuously and changes the polarity of the voltage. In this case series coupling of two varactors, oppositely relative each other, may be a kind of a solution, but owing to the operation of the forward voltage range of one of the diodes, nonlinearities will occur, and the phase noise of the multivibrator could be unacceptably high.

Another alternative is to change the current and as a result the speed of the capacitor recharge. This is a very efficient way of controlling the frequencies of the oscillations but its main disadvantage is its direct impact on pulse amplitudes.

SUMMARY OF THE INVENTION

It is an object of the present invention to provide a new voltage or current controlled oscillator circuit with a higher speed as compared with prior art circuits.

It is another object of the present invention to provide a new voltage or current controlled oscillator circuit with a lower operating voltage as compared with prior art circuits.

It is still another object of the present invention to provide a new voltage or current controlled oscillator circuit with a simple frequency control.

The invention relates to an oscillator circuit comprising an operating voltage supply,
- a first non-linear amplifier component comprising a first and a second main electrode and a control electrode,
- a second non-linear amplifier component comprising a first and a second main electrode and a control electrode, the first main electrode of the second amplifier component being connected to control the control electrode of the first amplifier component, and similarly the first main electrode of the first amplifier component being connected to control the control electrode of the second amplifier component,
- a capacitive component connected between the second main electrode of the first amplifier component and the second main electrode of the second amplifier component,
- a first and a second resistor via which the first main electrode of the first amplifier component, and the first main electrode of the second amplifier component, respectively, are connected to the first potential of the operating voltage supply. The oscillator is characterized in that it comprises
    - a third amplifier component whose first main electrode is connected to the second main electrode of the first amplifier component,
    - a fourth amplifier component whose first main electrode is connected to the second main electrode of the second amplifier component,
    - a first adjustable current source whose first terminal is connected to the second main electrodes of the third and the fourth amplifier components and whose second terminal is connected to the second potential of the operating voltage supply, the frequency of said oscillator being adjustable by controlling the current Icon of the first current source,
    - a fifth amplifier component whose first main electrode is connected to the first potential of the operating voltage supply, and whose control electrode is connected to the second main electrode or the control electrode of the first amplifier component,
    - a sixth amplifier component whose first main electrode is connected to the first potential of the operating voltage supply, and whose control electrode is connected to the second main electrode or the control electrode of the second amplifier component, the control electrodes of the third and the fourth amplifier components being cross-connected to the second main electrodes of the sixth and the fifth amplifier component, respectively;
    - means for providing a compensating current to flow via the first resistor and the second resistor, respectively, so that the current passing through each resistor is essentially constant and independent of the current Icon.

The relaxational oscillator of the invention is based on a new multivibrator structure. The multivibrator is provided with a fifth and a sixth amplifier component operating as active pull-down components. The pull-down amplifier components are cross-connected via a fifth and a sixth buffer transistor so that they are forced to alternate between a conducting and a non-conducting state according to the state of the first and the second amplifier component. When the second amplifier component is in a non-conducting state and the first amplifier component is in a conducting state, a third pull-down amplifier component, connected between the second main electrode of the first amplifier component and the second operating voltage potential, is in a non-conducting state. A fourth pull-down amplifier component connected between the second main electrode of the second amplifier component and the second operating voltage potential is in a conducting state and pulls down the second main electrode into the second operating voltage potential. In this case only one current path passes via the first amplifier component, the capacitive component and the fourth amplifier component. Similarly, when the first amplifier component is in a non-conducting state and the second amplifier component is in a conducting state, the fourth pull-down amplifier component in a non-conducting state and the third pull-down amplifier component is in a conducting state. In this case only one current path passes via the second amplifier component, the capacitive component and the third pull-down amplifier component. By means of pull-down technique, a two times higher output signal amplitude is achieved in this "double cross-connected" multivibrator circuit with the same operating voltage as compared with prior art multivibrator circuits. In addition, the pull-down technique significantly increases the speed of the multivibrator.

In the oscillator of the invention a control current is led via actively pulled down amplifier components and a first current source. A change in the control current causes a change in the oscillator output frequency. In order to make the amplitude of the oscillator output signal independent of the control current, an extra compensating current is led via resistors connected between the first and the second amplifier components and the first potential of the current source. The compensating current is preferably controlled similarly but in a different direction than the control current so that the current via the resistors is constant. This compensating current is provided by a seventh and an eight amplifier component, connected from the second main electrode of the first and the second amplifier component via the second current source into earth. The seventh and the eight amplifier components are connected to be positively driven to follow the states of the fourth and the third amplifier components, respectively.

The fifth and the sixth buffer amplifier means preferably also have corresponding pull-down amplifier components, cross-connected to be positively driven to follow the states of the third and the fourth pull-down transistor. This improves the speed of the oscillator and the logic levels.

BRIEF DESCRIPTION OF THE DRAWINGS

The invention will be described in the following with reference to the attached drawing, where.

DETAILED DESCRIPTION OF THE INVENTION

The present invention is applicable to lowering operating voltage, increasing speed and implementing frequency control in oscillators based on what are known as emitter-coupled multivibrator circuits. Although the oscillator shown in FIG. 2 comprises bipolar transistors as amplifier devices, in practice the circuit solution of the invention can employ any type of non-linear amplifier components, such as MOS, CMOS, SOI, HEMT and HBT transistors, micro wave tubes and vacuum tubes. The names of the electrodes in these components may vary. The main electrodes of a bipolar transistor are a collector and an emitter, a control electrode constituting the base. In FET transistors the corresponding electrodes are a drain, a source, and a gate. In vacuum tubes corresponding electrodes are usually called an anode, a cathode and a gate. This means that the term emitter-coupled multivibrator as used here has a more general meaning, covering e.g. the terms cathode-coupled or source-coupled multivibrator.

Figure 2:
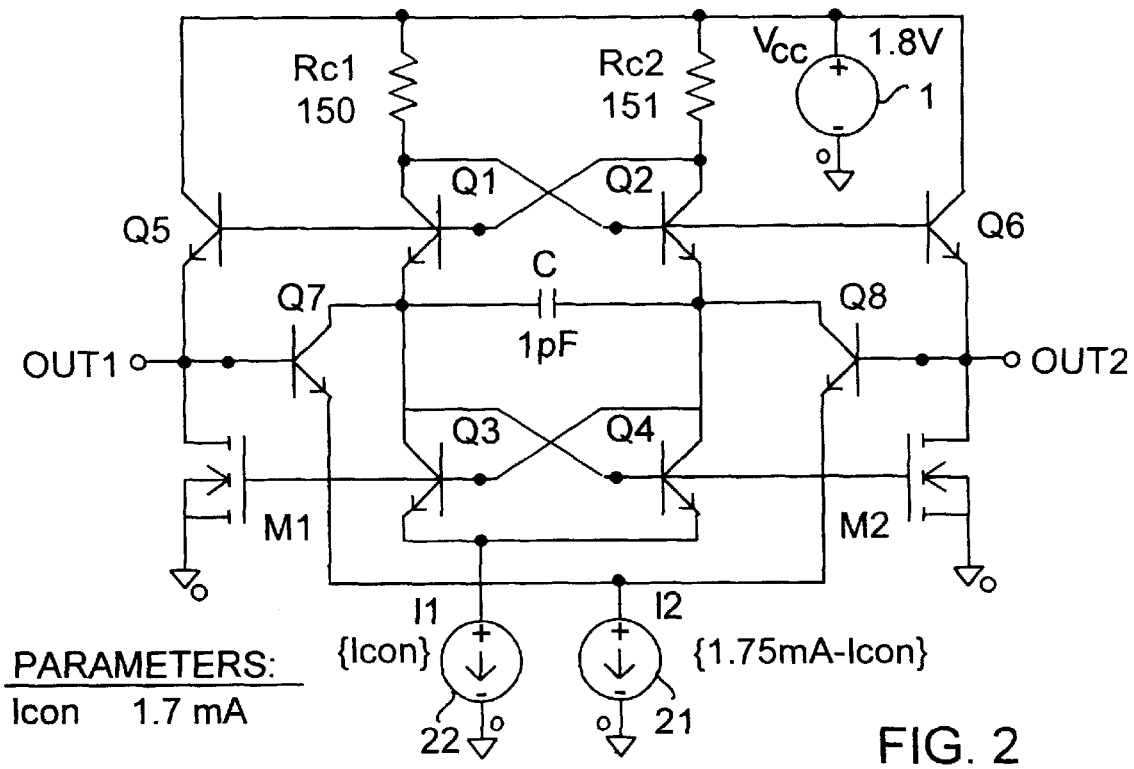
FIG. 2 is a circuit diagram of an oscillator of the invention.

FIG. 2 shows an oscillator according to the preferred embodiment of the invention and based on an emitter-coupled multivibrator circuit. Let us first study the structure of the actual multivibrator circuit.

A multivibrator circuit comprises six NPN bipolar transistors Q1, Q2, Q3, Q4, Q5 and Q6. The collector electrode of the transistor Q1 is connected via a resistor Rc1 to the operating voltage Vcc, and the emitter is connected to the collector of the transistor Q3. The collector of the transistor Q2 is connected via a resistor Rc2 to the operating voltage Vcc and the emitter to the collector of the transistor Q4. The emitters of the transistors Q3 and Q4 are connected together and via a current source 22 to an operating voltage potential 0 V. A capacitor C is connected between the emitters of transistors Q1 and Q2. A positive feedback is provided between the transistors Q1 and Q2 so that the base of Q1 is cross-connected to the collector of Q2, and the base of Q2 is cross-connected to the collector of Q1. Similarly, a positive feedback is provided between the transistors Q3 and Q4 so that the signals from the bases of the transistors Q1 and Q2 are connected via the buffer transistors Q5 and Q6, respectively to the bases of the pull-down transistors Q4 and Q3, respectively. The buffer transistors Q5 and Q6 enable the base currents of the transistors Q3 and Q4 to be increased, leading to more rapid discharge of the spurious capacitances of the base electrodes and, consequently, a higher switching speed of the transistors Q3, Q4. To be more exact, the collector of Q5 is connected to the operating voltage Vcc, the base is connected to the base of Q1, and the emitter is connected to the base of Q4. Correspondingly, the collector of Q6 is connected to the operating voltage Vcc, the base to the base of Q2, and the emitter to the base of Q3. Additionally, a pull-down transistor M1, a MOS transistor, is connected in series between the emitter of Q5 and the operating voltage 0 V. In the same way a pull-down transistor M2, a MOS transistor, is connected between the emitter of Q6 and the operating voltage 0 V. M1 and M2 are cross-connected to be positively driven to follow the states of the pull-down transistors Q3 and Q4, respectively. More exactly, the base of M1 is connected to the base of Q3 and the base of M2 is connected to the base of Q4.

Positive feedback and the series-resonant circuits Rc1-C and Rc2-C formed by the resistors Rc1, Rc2 and the capacitor C make the multivibrator output (e.g. the emitter of Q2) oscillate between two states once oscillation has been triggered. The resonance frequency of the circuit is set by the values of the components Rc1, Rc2, and C.

Figure 1:
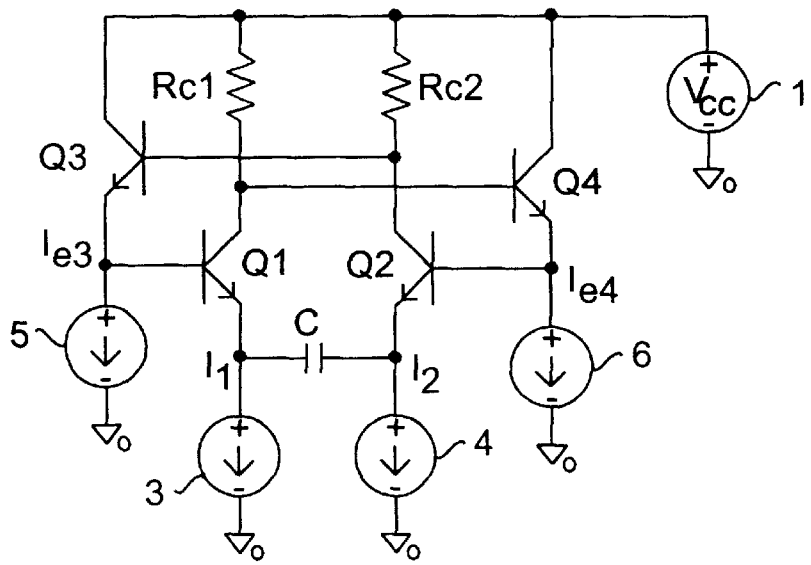
FIG. 1 is a circuit diagram of a prior art multivibrator.

In a multivibrator circuit of the invention, the pull-down transistors Q3 and Q4 replace the current sources of the conventional multivibrator circuit, shown in FIG. 1. Owing to the cross-connection of the transistors Q3 and Q4 they are positively driven to alternate between on or off states according to the states of the transistors Q1 and Q2. Let us assume, for example, that the transistor Q1 is on and the transistor Q2 is off. In this case the emitter of the transistor Q1 inputs a base current to the base of the transistor Q4 making it conductive. In a conducting state the transistor Q4 pulls down the emitter voltage of Q2 to the potential 0 V almost without voltage drop. As a result, the transistor Q3, whose base is connected to the emitter of Q2, is off, and no current passes through Q3. Now the multivibrator circuit only has one current path, that is Rc1-Q1-C-Q4. The transistor Q3, which is not conductive, fully separates one terminal of the capacitor C from the potential 0 V. The transistor Q4, which is on, connects the other terminal of the capacitor C to the potential 0 V almost without voltage drop, if the current source 22 is considered ideal. Similarly, in another oscillation state, Q1 is off, Q2 is on, Q3 is on and Q4 is off. In this case the multivibrator circuit only has one current path, that is Rc2-Q2-C-Q3. Q4, which is off, fully separates one terminal of the capacitor C from the potential 0 V. The transistor Q3, which is on, pulls down the other terminal of the capacitor C to the potential 0 V almost without voltage drop, if the current source 22 is considered ideal. This way as high a portion as possible of the operating voltage is provided across the capacitor. Consequently, as the cross-connected pull-down transistors Q3 and Q4 make it possible to eliminate voltage drop caused by current sources in conventional multivibrator circuits, a multivibrator circuit implemented by the double cross-connected pull-down technique of the invention generates a two times higher output signal amplitude at the same operating voltage as compared with the conventional circuit of FIG. 1.

In practice the current source 22, however, consists of e.g. a voltage-controlled current mirror. In this case a voltage drop is present across the current mirror and hence a slightly higher operating voltage is required, e.g. approx. 2.2 V.

By control of the current I1 passing through the current source 22 the frequency of the oscillator can be controlled. If the current source 22 is composed of a voltage-controlled current mirror, a voltage-controlled oscillator VCO is provided. If the current source 22 is implemented by a current-controlled circuit solution, a current-controlled oscillator is provided. These different implementations of a current source 22 are obvious to those skilled in the art.

The oscillator oscillates between two states. In the first state the control current I1 passes via the path Rc1-Q1-C-Q4 to the current source 22. In the second state the control current I1 flows via the path Rc2-Q2-C-Q3 to the current source 22. Hence the control current also passes via the collector resistors Rc1 and Rc2 and affects the amplitude of the oscillator output signal. That is, the signal amplitude changes as the control current I1 and the frequency are changed.

In the oscillator of the invention the amplitude of the oscillator output signal is made independent of the control current I1 so that an extra compensating current I2 is led through the resistors Rc1 and Rc2. The compensating current I2 is preferably controlled in the same way as but into a different direction than the control current I1 so that the total current via the resistors Rc1 and Rc2 is constant. In the example of FIG. 2, the control current I1=Icon and I2=1.75 mA-Icon. For this purpose the oscillator circuit comprises the transistors Q7 and Q8, connected from the emitters of Q1 and Q2, respectively, via a second current source 21 to the operating voltage potential 0 V. Q7 and Q8 are connected to be positively driven to follow the states of Q4 and Q3, respectively. More exactly, the collector of Q7 is connected to the emitter of Q1, the base is connected to the base of Q4, and the emitter is connected to the first terminal of the current source 21. Similarly, the collector of Q8 is connected to the emitter of Q2, the base is connected to the base of Q3, and the emitter is connected to the first terminal of the current source 21. The second terminal of the current source is connected to the operating voltage potential 0 V.

In the first oscillation state of the oscillator the control current I1 passes via the path Rc1-Q1-C-Q4 to the current source 22. Q7 and Q4 are both on at the same time, and thus the compensating current I2 passes by the path Rc1-Q1-Q7 to the current source 21. This way a constant current I1+I2 passes through the resistor Rc1 irrespective of the value of I1. The situation is similar for the current passing through the resistor Rc2 in the second oscillation state.

Figure 3:
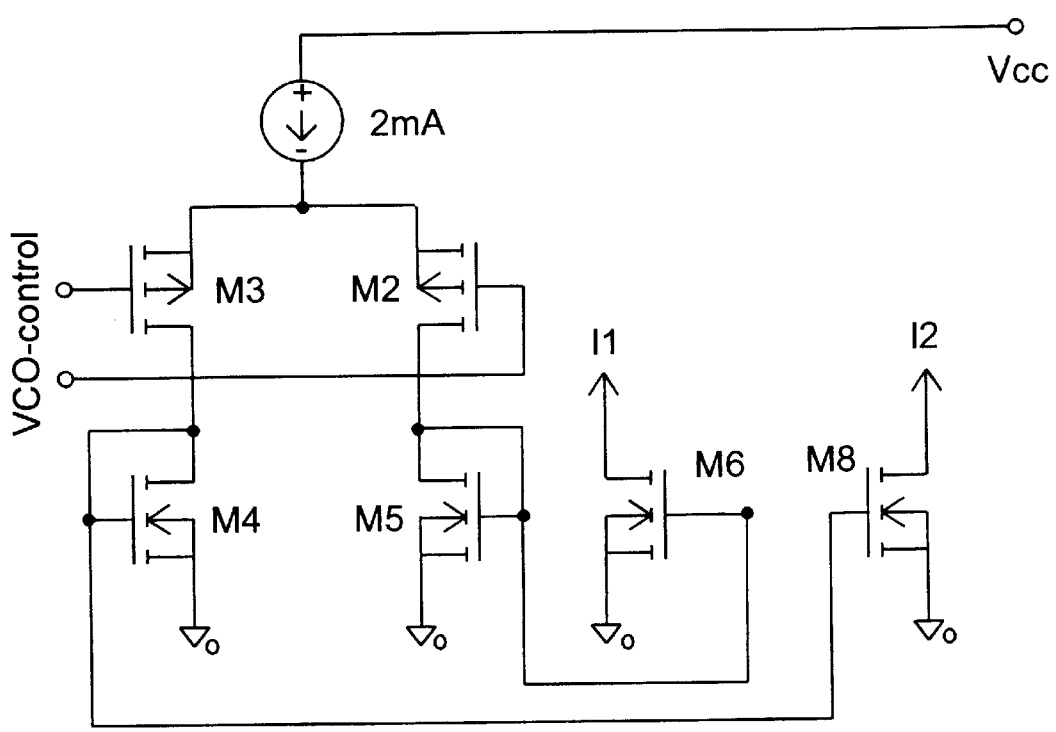
FIG. 3 is a circuit diagram of a controlled current source.

FIG. 3 shows one way of implementing a VCO in the circuit of FIG. 2. In FIG. 3 the currents I1 and I2 are provided by current mirrors M6 and M8 controlled by a differential amplifier M2-M3-M4-M5. The differential amplifier is controlled by a control voltage VCOcontrol.

The circuit of FIG. 2 has been analyzed by the 0,8 $\mu$m BiCMOS technology, in which bipolar NPN transistors have a transient frequency $F_T$=14 GHz. The current passing through the transistors is selected so that it provides the transient frequency of $F_T$, the current being about 850 $\mu$A using this technology, when the collector-emitter voltage $V_{ce}$ is about 0.8 V. This is why the current source 22, which determines the currents flowing through the transistors Q1 and Q3, and the transistors Q2 and Q4, respectively, is Icon=1.7 nA when it is desirable to have the oscillation occur at the highest possible frequency, in this case about 1.4 GHz. In this case I2=1.75 mA-Icon. The control capacity of the oscillator may be 320 MHz/mA, thus exceeding many times the requirements set on such circuits. The phase noise is low because the linear recharging process of the capacitor C is maintained even at high speed. Very high frequencies may be provided by the circuit, e.g. when the capacitor C=0.35 pF, the pulse cycle is 500 ps (2 GHz). The amplitude is about 550 mV and power consumption less than 5.1 mW from a operating voltage of 2.2 V. The pulse form of the signal is also very good.

The invention may be implemented solely by the Bipolar technique.

Low phase noise also makes the oscillator circuit suitable for construction of high-speed phase-locked loops (PLL) in various communications and microprocessor applications.

The drawings and the related description have been presented for purposes of illustration only. The details of the invention may be modified within the scope and spirit of the appended claims.

We claim:

1. An oscillator circuit comprising an operating voltage supply (1), a first non-linear amplifier component (Q1) comprising a first and a second main electrode and a control electrode, a second non-linear amplifier component (Q2) comprising a first and a second main electrode and a control electrode, the first main electrode of the second amplifier component (Q2) being connected to control the control electrode of the first amplifier component (Q1), and similarly the first main electrode of the first amplifier component (Q1) being connected to control the control electrode of the second amplifier component (Q2), a capacitive component (C) connected between the second main electrode of the first amplifier component (Q1) and the second main electrode of the second amplifier component (Q2), a first and a second resistor (Rc1,Rc2) via which the first main electrode of the first amplifier component (Q1), and the first main electrode of the second amplifier component (Q2), respectively, are connected to the first potential of the operating voltage supply (1), a third amplifier component (Q3) whose first main electrode is connected to the second main electrode of the first amplifier component (Q1), a fourth amplifier component (Q4) whose first main electrode is connected to the second main electrode of the second amplifier component (Q2), a first adjustable current source (22) whose first terminal is connected to the second main electrodes of the third and the fourth amplifier components (Q3,Q4) and whose second terminal is connected to the second potential of the operating voltage supply (1), the frequency of said oscillator being adjustable by controlling the current Icon of the first current source, a fifth amplifier component (Q5) whose first main electrode is connected to the first potential of the operating voltage supply, and whose control electrode is connected to the second main electrode or the control electrode of the first amplifier component (Q1), a sixth amplifier component (Q6) whose first main electrode is connected to the first potential of the operating voltage supply, and whose control electrode is connected to the second main electrode or the control electrode of the second amplifier component (Q2), the control electrodes of the third and the fourth amplifier components (Q3,Q4) being cross-connected to the second main electrodes of the sixth (Q6) and the fifth (Q5) amplifier component, respectively, means (Q7,Q8,21) for providing a compensating current to flow via the first resistor (Rc1) and the second resistor (Rc2), respectively, so that the current passing through each resistor is essentially constant and independent of the current Icon.

2. An oscillator as claimed in claim 1, wherein said means comprise a seventh amplifier component (Q7) whose first main electrode is connected to the second main electrode of the first amplifier component (Q1) and whose control electrode is connected to the second main electrode of the fifth amplifier component (Q5), an eight amplifier component (Q8) whose first main electrode is connected to the second main electrode of the second amplifier component (Q2) and whose control electrode is connected to the second main electrode of the sixth amplifier component (Q6), a second controlled current source (21) whose first terminal is connected to the second main electrodes of the seventh and the eight amplifier components (Q7,Q8) and whose second terminal is connected to the second potential of the operating voltage supply (1).

3. An oscillator as claimed in claim 2, wherein the first current source is controllable so that the current of the second current source $I2 = I_x - Icon$, where $I_x$ is a predetermined constant current.

4. An oscillator as claimed in claims 1, 2 or 3, comprising a ninth amplifier component (M1), connected between the second main electrode of the fifth amplifier component (Q5) and the second potential of the operating voltage supply (1), and whose control electrode is connected to the control electrode of the third amplifier component (Q3), a tenth amplifier component (M2), connected between the second main electrode of the sixth amplifier component (Q6) and the second potential of the current source (1), and whose control electrode is connected to the control electrode of the fourth amplifier component (Q4).

5. A multivibrator circuit as claimed in claim 4, wherein the first, second, third, fourth, fifth, sixth, seventh and eight amplifier components are bipolar transistors, and that the ninth and tenth amplifier components are MOS transistors.

* * * * *